(12) United States Patent
Ross et al.

(10) Patent No.: US 7,148,758 B1
(45) Date of Patent: Dec. 12, 2006

(54) INTEGRATED CIRCUIT WITH DIGITALLY CONTROLLED PHASE-LOCKED LOOP

(75) Inventors: James P. Ross, Lakeville, MN (US); Michael J. Gaboury, Burnsville, MN (US)

(73) Assignee: Xilinx, Inc., San Jose, CA (US)

( * ) Notice: Subject to any disclaimer, the term of this patent is extended or adjusted under 35 U.S.C. 154(b) by 14 days.

(21) Appl. No.: 10/917,564

(22) Filed: Aug. 13, 2004

(51) Int. Cl.
*H03L 7/00* (2006.01)
(52) U.S. Cl. .............................. 331/17; 331/16; 331/44
(58) Field of Classification Search .................. 331/17, 331/16, 44
See application file for complete search history.

(56) References Cited

U.S. PATENT DOCUMENTS

| | | | |
|---|---|---|---|
| 5,663,689 A | * | 9/1997 | Baumgartner et al. ........ 331/17 |
| 6,114,915 A | * | 9/2000 | Huang et al. .................. 331/25 |
| 6,356,160 B1 | | 3/2002 | Robinson et al. |
| 6,441,690 B1 | * | 8/2002 | Savelli et al. ................ 331/1 A |
| 6,466,100 B1 | * | 10/2002 | Mullgrav et al. ........... 331/179 |
| 6,566,966 B1 | * | 5/2003 | Bellaouar et al. ............. 331/10 |
| 6,650,720 B1 | | 11/2003 | Grung et al. |

\* cited by examiner

*Primary Examiner*—Joseph Chang
(74) *Attorney, Agent, or Firm*—Scott Hewett; Kim Kanzaki

(57) ABSTRACT

An integrated circuit ("IC") includes a phase-locked loop ("PLL") with a controllable oscillator embedded in the integrated circuit. A phase-lock circuit provides a lock control signal to the controllable oscillator; and a digital-to-analog converter ("DAC") provides an oscillator adjustment signal to the controllable oscillator according to a digital code. The digital code is generated by an adjustment circuit configured in the fabric of a programmable logic device, or embedded in the IC, for example. In a particular embodiment, the DAC adjusts the PLL to reduce differential mode voltage in the phase-lock circuit.

20 Claims, 2 Drawing Sheets

US 7,148,758 B1

INTEGRATED CIRCUIT WITH DIGITALLY CONTROLLED PHASE-LOCKED LOOP

FIELD OF THE INVENTION

This invention relates generally to integrated electronic circuits and more specifically to phase lock loops with digitally controlled adjustment of an oscillator.

BACKGROUND OF THE INVENTION

A voltage-controlled oscillator ("VCO") is an important functional block in many types of analog, digital, and mixed-signal circuits. For example, VCOs are used in phase-locked loops ("PLLs") that are used in clock generation, tuning circuits, and frequency synthesis. There are many types of VCOs. A type of VCO that is often used in PLLs on integrated circuits ("ICs") is a ring oscillator.

A ring oscillator generally passes a signal pulse (such as an input clock signal) from one delay element to the next. The amount of delay each delay element provides is typically controlled by selecting the bias current or bias voltage applied to the delay elements. Typically, a higher bias current decreases the delay of the delay element(s), and the frequency of the ring oscillator increases. Even though some ring oscillators operate according to the amount of current provided to them, these ring oscillators are commonly referred to as "VCOs", which is used below to describe current-controlled ring oscillators for convenience of discussion.

However, the performance and operating point of the PLL can depend on many factors, such as variations in the fabrication process, operating temperature drift, and supply voltage. Many PLL systems have a mechanism for adjusting the operating point of the PLL. One technique is to open the PLL and set the frequency of the VCO with an analog circuit to a desired center frequency. The PLL is then closed, and the PLL circuitry locks the VCO to a reference. However, opening the PLL removes some components of the PLL that might otherwise contribute to setting the center frequency; hence, the effect these elements have on the nominal operating frequency is not accounted for, and may pull the VCO frequency above or below the desired center frequency when the PLL is closed.

Similarly, although opening the PLL and adjusting the center frequency of the VCO improves the operation of the VCO at power-up, factors that affect the operation of the VCO can change over time. For example, local changes in the power supply voltage and operating temperature, which can be caused by external effects, cause the nominal operating point of the VCO to drift. Such drift creates an asymmetry in the PLL to adjust for over- and under-frequency conditions. For example, if the nominal operating point of the VCO increases with increasing temperature, some portion of the dynamic tuning range of the PLL is used to pull the VCO back down to the desired center frequency, limiting the range available to pull the VCO down to maintain phase lock.

Another technique uses fast and slow analog feedback loops to control a VCO. The fast analog feedback loop is used to track the reference signal in the PLL, and the slow feedback loop is used to maintain the operating point of the VCO near the desired center frequency according to a differential voltage going into the VCO transconductance circuit. The response time of the slow loop is sufficiently long to avoid interfering with phase locking ("loop dynamics") of the PLL. In some cases, physically large components are used in the slow analog loop to slow the response time, and the gain of the loop amplifier can be difficult to adjust. Similarly, process variations and temperature variations can affect the performance of the slow analog feedback loop, both initially and during operation of the PLL.

Therefore, there is a need for improved PLLs.

SUMMARY OF THE INVENTION

An integrated circuit ("IC") includes a phase-locked loop ("PLL") with a controllable oscillator embedded in the integrated circuit. A phase-lock circuit provides a lock control signal to the controllable oscillator; and a digital-to-analog converter ("DAC") provides an oscillator adjustment signal to the controllable oscillator according to a digital code. The digital code is generated by an adjustment circuit configured in the fabric of a programmable logic device, or embedded in the IC, for example. In a particular embodiment, the DAC adjusts the PLL to reduce differential mode voltage in the phase-lock circuit.

DETAILED DESCRIPTION OF THE DRAWINGS

Figure 1:
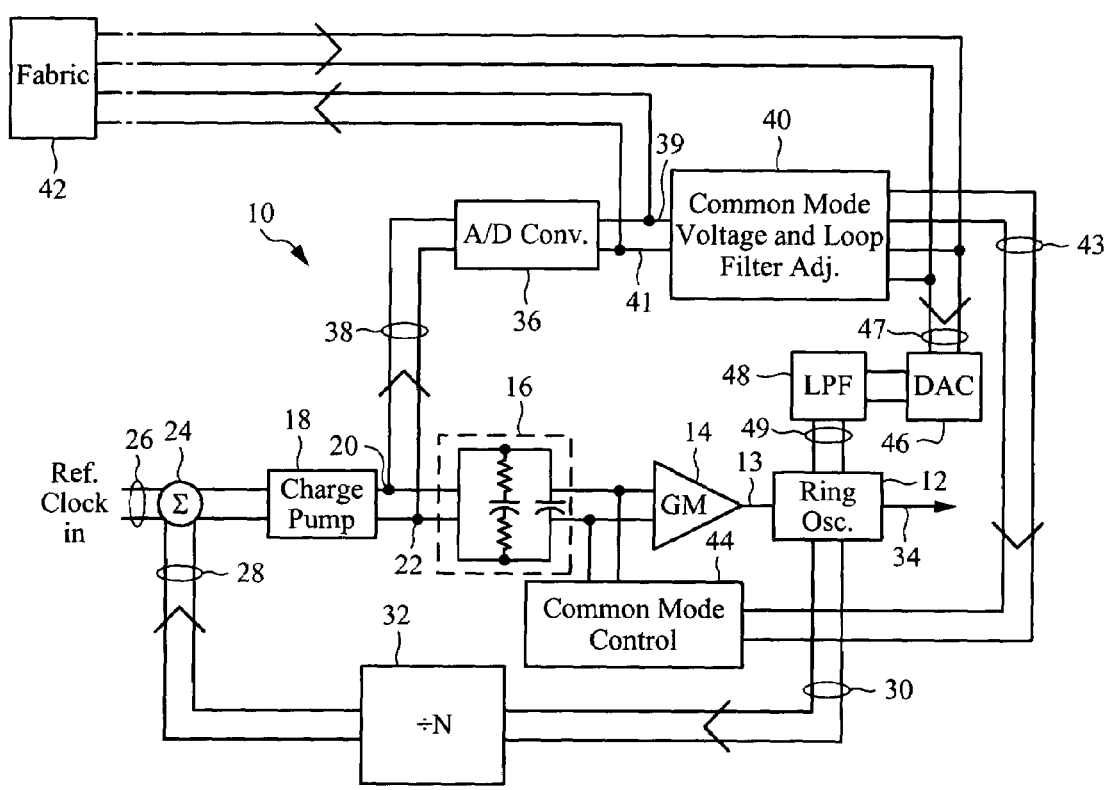
FIG. 1 is a simplified diagram of a PLL according to an embodiment of the invention.

FIG. 1 is a simplified diagram of a PLL 10 according to an embodiment of the invention. The PLL 10 is incorporated on an IC, such as a programmable logic device ("PLD"), examples of which include a complex programmable logics devices ("CPLD") and a field-programmable gate array ("FPGA"), a transmitter, a receiver, a transceiver including a multi-gigabit transceiver (MGT), an application-specific integrated circuit ("ASIC") and a processor. The PLL 10 has a fast analog loop that maintains phase/frequency lock during operation, and a digital loop that is used to calibrate and adjust the nominal operating point of the PLL.

In the fast analog loop, a ring oscillator 12 is driven by a lock control signal 13 from a transconductance circuit 14. The transconductance circuit 14, also known as a loop gain module, converts voltage developed by a loop filter 16 to current, which is provided to the ring oscillator 12. As discussed in the Background section, the ring oscillator 12 is commonly referred to as a "VCO," even though it is a current-controlled device. Other types of oscillators are alternatively used.

The ring oscillator 12 typically has 3–6 delay elements; however, this range of delay elements is merely exemplary. Additional information on ring oscillators and their use in PLLs is found in U.S. Pat. No. 6,356,160 by Robinson et al., issued Mar. 12, 2002 to Xilinx, Inc., the disclosure of which is hereby incorporated by reference in its entirety for all purposes. Additional information on transconductance circuits is found in U.S. Pat. No. 6,650,720 by Grung et al., issued Nov. 18, 2003 to Xilinx, Inc., the disclosure of which is hereby incorporated by reference in its entirety for all purposes.

The loop filter 16 converts differential current from a charge pump 18 to a first voltage 20 and a second voltage 22, which are provided to the transconductance circuit 14. The loop filter is shown as a network of resistors and capacitors, and many alternative loop filter topologies, including loop filters incorporating inductors, are possible. The individual elements of the loop filter (e.g. resistors and capacitors) are often implemented using complementary metal-oxide semiconductor ("CMOS") techniques, and are programmable in some embodiments.

The difference between the first voltage 20 and the second voltage 22 is known as the differential voltage, and the average of the first and second voltages 20, 22 is known as the common mode voltage. Both the common mode and differential voltages can affect the operation of the PLL 10. It is generally desirable to operate at nominally zero differential voltage to allow use of the entire dynamic tuning range of the PLL.

The charge pump 18 receives a pulse train (stream) from a phase/frequency detector ("PFD") 24. The PFD 24 produces the pulse train according to the difference in phase and/or frequency between a reference clock signal input 26 and a second input 28. In this example, the second input 28 is an output 30 of the ring oscillator divided by a divider circuit 32. The divider circuit 32 divides the output 30 of the ring oscillator 12 by a value "N," which is an integer, or alternatively a non-integer value, to produce a "divided oscillator output".

For example, if the reference clock signal operates at 625 MHz and N=16, the PLL 10 locks the output of the VCO comprising the ring oscillator 12 and gm circuit 14, to 10 GHz (16 times 625 MHz). Thus, the PLL 10 can be used to generate an on-chip clock signal that is synchronized with the input clock signal, which typically originates off-chip. The on-chip clock signal is much higher in frequency, improving the speed of on-chip operations. Alternatively, the PLL 10 provides an output or outputs that are at the same frequency (N=1, or the divider circuit is omitted), with a skewed clock signal or quadrature outputs, for example.

The ring oscillator 12 has an optional second output 34. In some embodiments, the second output is in phase with the output 30 provided to the divider circuit 32 and is coupled to other circuits that are typically on the IC, but may be coupled to circuits or other devices external to the IC. In other embodiments, the second output is tapped from between delay elements of the ring oscillator 12 and provides a selected clock skew with respect to the reference clock input signal 26. In an alternative embodiment, the second output is ninety degrees out of phase with the output 30 coupled to the divider circuit 32, and the output 30 and second output 34 are coupled to other circuits as quadrature outputs. In yet another embodiment, the second output 34 includes two outputs in quadrature.

A digital control loop of the PLL 10 adjusts the nominal center frequency of the VCO (the ring oscillator 12 and gm circuit 14) at power-up, and optionally for changes in conditions during operation of the PLL 10. An analog-to-digital ("A/D") converter 36 measures both sides of the loop filter 16 (i.e. the first voltage 20 and the second voltage 22) and converts these voltages into a first digital output 39 and a second digital output 41 that are coupled to an adjustment circuit 40, and optionally to the fabric 42 of an FPGA, for example. The first digital output 39 is proportional to the first voltage 20 and the second digital output 41 is proportional to the second voltage. Measuring both sides of the loop filter allows computing both the common mode and differential mode voltages. The loop filter voltages are commonly referred to as "positive" and "negative."

In one embodiment, the adjustment circuit 40 digitally adjusts the differential loop filter voltage of the PLL. In an alternative embodiment the adjustment circuit digitally adjusts the common mode voltage of the PLL, and in another embodiment, the adjustment circuit digitally adjusts the common-mode voltage and the differential loop filter voltage. Although the fabric 42 is shown as being separate from the elements of the PLL 10, one or more elements of the PLL, such as the adjustment circuit 40, are alternatively implemented in the fabric 42 of a PLD.

The differential loop filter voltage is desirably zero when the PLL is locked. This condition optimizes the dynamic range of the PLL. If the differential loop filter voltage is not zero, the digital control loop can apply a digitally generated current to the ring oscillator 12 to move the differential voltage back toward zero Volts. Similarly, it is desirable that the common mode voltage (i.e. the average of the two voltages supplied by the loop filter 16 to the transconductance circuit 14) be set to a value determined according to the characteristics of the charge pump 18 and transconductance circuit 14, particularly for low-voltage chip supplies. For example, if the IC operates from a 1.1 to 1.2 Volt supply, only about ±300 mV to about +400 mV might be available to adjust the tuning range of the VCO 12.

The common mode voltage is adjusted according to digital code 43 generated in the adjustment circuit 40. The digital code is coupled to a common mode control circuit 44 that changes a reference voltage according to the digital code 43 and applies a correction voltage(s) to the loop filter voltages. Alternatively, the charge pump current output is adjusted according to the digital code and/or the values of elements (e.g. resistors and capacitors) in the loop filter 16 are adjusted (not shown).

A digital-to-analog converter ("DAC") 46 generates current according to digital code 47 from the adjustment circuit 40 according to the differential voltage (loop filter voltages) measured by the A/D converter 36. The DAC 46 is typically designed to provide a selected amount of current to the ring oscillator 12 when it is operating at its desired center frequency. This allows the frequency of the VCO (i.e, the ring oscillator 12 and gm circuit 14) to be tuned either up (e.g. by increasing current) or down (e.g. by decreasing current) according to an oscillator adjustment signal 49. A low-pass filter 48 between the DAC 46 and the ring oscillator 12 keeps high-frequency signals that might be generated by the DAC 46 from interfering with the loop dynamics of the PLL 10.

Upon initial start-up of the PLL 10, the power supply voltage, temperature of operation, and manufacturing process variation can all affect the nominal operating frequency of the PLL 10. The digital control loop that includes the A/D converter 36 and DAC 46 allow the PLL 10 to be calibrated and adjusted with the PLL closed, and therefore the calibration of all elements in the PLL are accounted for during calibration. Similarly, the digital loop can adjust the PLL 10 as operating conditions, such as temperature and supply voltage, change. The digital loop operates much more slowly than the fast analog loop, and is settable to operate arbitrarily slowly. For example, a timing circuit in the fabric 42 could periodically enable the DAC 46, which is otherwise disabled during operation.

In a particular embodiment, on-chip digital filtering is used to adjust the update rate of the digital loop (DAC 46). In an alternative embodiment, on-chip or off-chip sensors detect when a condition, such as temperature or supply voltage, has changed, and enable the digital loop to adjust the PLL when a condition threshold is reached. In yet another embodiment, the digital loop is enabled when the differential voltage and/or common mode voltage exceeds a selected threshold.

The DAC 46 is sized such that all desired operating points (frequencies) from the VCO are obtainable. For example, if the VCO nominally operates at 10 GHz, and +20% adjustment range is desirable, the DAC 46 is sized so that current provided to the VCO from the DAC 46 is sufficient to tune the VCO from 8 GHz to 12 GHz. These values are merely exemplary.

Figure 2:
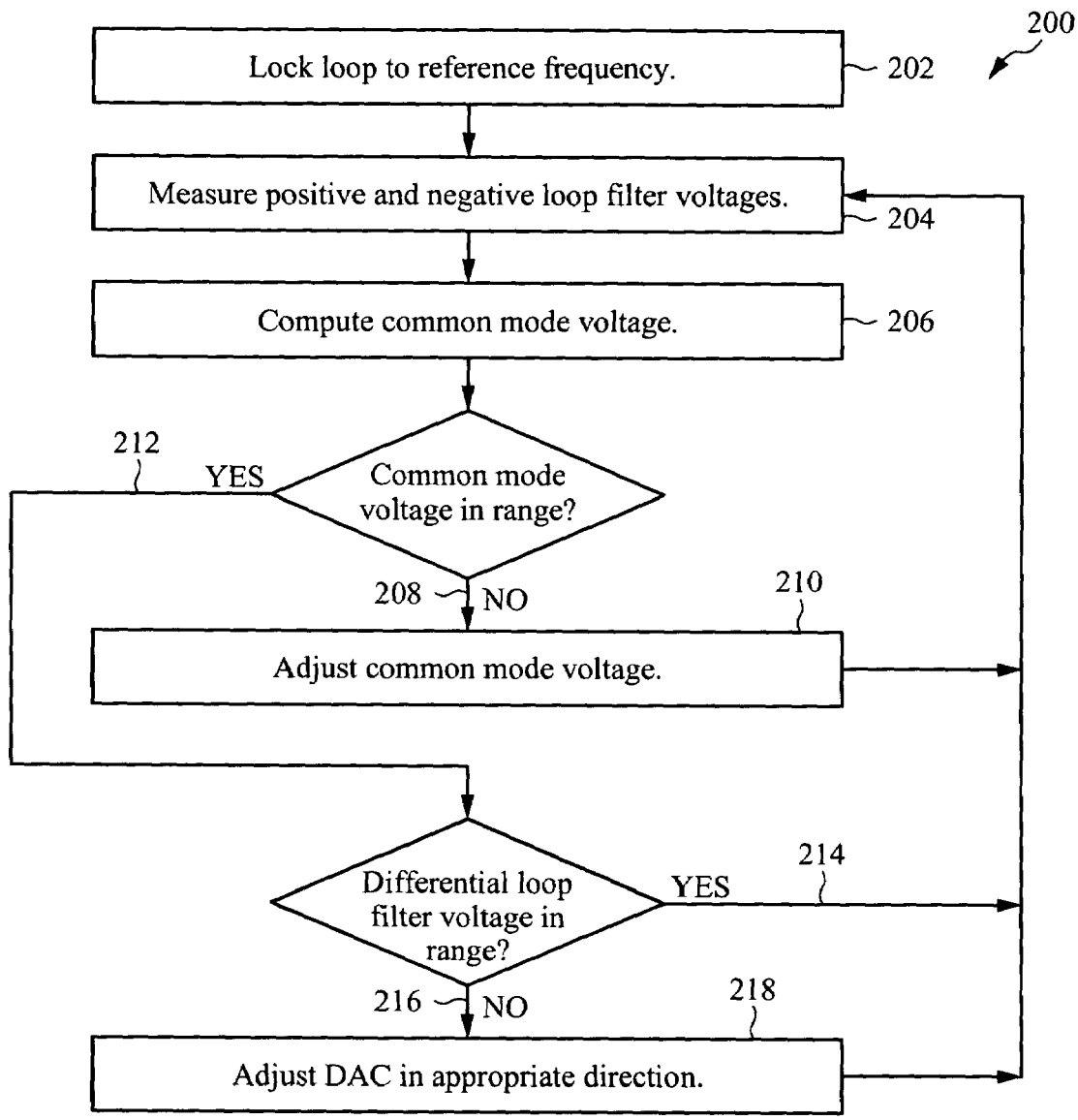
FIG. 2 is a simplified flow chart of a method of adjusting a PLL according to an embodiment of the present invention.

FIG. 2 is a simplified flow chart of a method of adjusting a PLL 200 according to an embodiment of the present invention. The PLL is locked to a reference frequency (step 202) and the positive and negative loop filter voltages are measured (step 204), such as with an A/D converter (see FIG. 1, ref. num. 36). The common mode voltage is calculated from digital values representing the positive and negative loop filter voltages (PLL lock control voltages) (step 206).

The common mode voltage is evaluated to determine whether it is within a selected range, and if it is not within the selected range (decision branch 208), the common mode voltage is adjusted (step 210). The common mode voltage can be adjusted by adding a voltage from a common mode control circuit (see FIG. 1, ref. num. 44), or alternatively by adjusting the charge pump current and/or by adjusting component values in the loop filter, for example. In a particular embodiment, the common mode voltage is digitally adjusted. The loop filter voltages are again measured to verify that the adjustment to the common mode voltage was correct and that the loop filter voltages are within range.

If the common mode voltage is within the selected range (decision branch 212), the differential loop filter voltage is evaluated to determine whether it is within a selected range. If the differential loop filter voltage is within its selected range (decision branch 214), the loop filter voltages are again measured to monitor the operation of the PLL. Alternatively, the process stops after adjusting the DAC until the process is re-initiated.

If the differential loop filter voltage is not within its selected range (decision branch 216), the DAC (see FIG. 1, ref. num. 46) is adjusted (step 218) in the appropriate direction (e.g. to provide more current or less current to the ring oscillator (FIG. 1, ref. num. 12)), or alternatively by adjusting the charge pump current and/or by adjusting component values in the loop filter.) to bring the differential loop filter voltage into range. The loop filter voltages are again measured to monitor the operation of the PLL and/or to verify that the adjustment to the DAC put the loop filter voltages in range. Alternatively, the process stops after adjusting the DAC until the process is re-initiated.

The foregoing detailed description discusses embodiments of the invention with reference to the accompanying figures. These embodiments are described and illustrated in sufficient detail to enable one of ordinary skill in the art to practice the invention. It is understood that other embodiments may be utilized without departing from the spirit and scope of the invention. Therefore, the foregoing detailed description is not to be taken in a limiting sense.

The invention claimed is:

1. An integrated circuit having a phase-locked loop ("PLL") comprising:
   a controllable oscillator embedded in the integrated circuit;
   a phase-lock circuit providing a lock control signal to the controllable oscillator;
   a digital-to-analog converter providing an oscillator adjustment signal to the controllable oscillator according to a digital code;
   an adjustment circuit, wherein the digital code is generated by the adjustment circuit; and
   a common mode control circuit coupled to a common mode voltage of the phase-lock circuit and providing a common mode voltage adjustment according to a second digital code from the adjustment circuit.

2. The integrated circuit of claim 1 wherein the controllable oscillator is a ring oscillator.

3. The integrated circuit of claim 1 wherein the integrated circuit is a programmable logic device.

4. The integrated circuit of claim 3 further comprising a fabric portion of the programmable logic device, wherein the digital code is generated by the fabric portion.

5. The integrated circuit of claim 4 wherein the digital code is generated according to a voltage of the phase-lock circuit.

6. The integrated circuit of claim 1 wherein the integrated circuit is a programmable logic device and at least a portion of the adjustment circuit is embedded in the programmable logic device.

7. An integrated circuit having a phase-locked loop ("PLL") comprising:
   a phase detector having a first input port, a second input port, and an output port;
   a charge pump coupled to the output port of the phase detector configured to provide a first voltage output and a second voltage output;
   an analog-to-digital converter coupled across the first voltage output and the second voltage output from the charge pump, and producing a first digital output proportional to the first voltage output and a second digital output proportional to the second voltage output;
   an adjustment circuit coupled to the first digital output and the second digital output providing a differential voltage adjustment output;
   a digital-to-analog converter coupled to the differential voltage adjustment output and providing an oscillator adjustment signal;
   an oscillator incorporated in the integrated circuit coupled to the oscillator adjustment signal and providing an oscillator output signal according at least in part to the oscillator adjustment signal; and
   a transconductance circuit for providing a lock control signal to the oscillator in response to the first voltage output and the second voltage output.

8. The integrated circuit of claim 7 further comprising a divider circuit between the oscillator output signal and the phase detector to provide a divided oscillator output signal to the second port of the phase detector.

9. The integrated circuit of claim 8 wherein a reference clock signal is coupled to the first input port of the phase detector.

10. The integrated circuit of claim 9 wherein the reference clock signal is a system clock signal and the oscillator output signal is an integrated circuit clock signal.

11. The integrated circuit of claim 7 wherein the oscillator is embedded in a programmable logic device.

12. The integrated circuit of claim 7 wherein the oscillator is embedded in a field-programmable gate array.

13. The integrated circuit of claim 7 wherein the oscillator is a ring oscillator.

14. The integrated circuit of claim 7 wherein the oscillator provides a second oscillator output signal.

15. The integrated circuit of claim 14 wherein the oscillator output signal and the second oscillator output signal have a selected phase difference.

16. A method of adjusting a phase-locked loop ("PLL") of an integrated circuit comprising:
   locking the PLL to a reference frequency;

measuring a first lock loop voltage and a second lock loop voltage of the PLL;

calculating a common mode voltage of the PLL from digital values representing the first loop voltage and the second loop voltage;

adjusting the common mode voltage; and adjusting a differential voltage of the PLL by providing an oscillator adjustment signal from a digital-to-analog converter to a controllable oscillator of the integrated circuit.

17. The method of claim 16 wherein one of the first lock loop voltage and the second lock loop voltage is a ground voltage of the integrated circuit.

18. The method of claim 16 wherein the step of measuring is done with an analog-to-digital converter and includes converting the first lock loop voltage to a first digital output and converting the second lock loop voltage to a second digital output.

19. The method of claim 16 wherein the differential voltage is adjusted according to the digital values representing the first loop voltage and the second loop voltage.

20. The method of claim 19 wherein the controllable oscillator is a ring oscillator and the oscillator adjustment signal is a selected current.

* * * * *